(12) United States Patent
Taniguchi et al.

(10) Patent No.: US 8,887,383 B2
(45) Date of Patent: Nov. 18, 2014

(54) ELECTRODE STRUCTURE AND METHOD FOR FORMING BUMP

(75) Inventors: Yasushi Taniguchi, Osaka (JP); Seiichi Nakatani, Osaka (JP); Takashi Kitae, Osaka (JP); Seiji Karashima, Osaka (JP); Kenichi Hotehama, Osaka (JP)

(73) Assignee: Panasonic Corporation, Osaka (JP)

( * ) Notice: Subject to any disclaimer, the term of this patent is extended or adjusted under 35 U.S.C. 154(b) by 994 days.

(21) Appl. No.: 12/518,358

(22) PCT Filed: Nov. 27, 2007

(86) PCT No.: PCT/JP2007/072795
§ 371 (c)(1),
(2), (4) Date: Jun. 9, 2009

(87) PCT Pub. No.: WO2008/075537
PCT Pub. Date: Jun. 26, 2008

(65) Prior Publication Data
US 2010/0044091 A1 Feb. 25, 2010

(30) Foreign Application Priority Data

Dec. 18, 2006 (JP) ................................. 2006-339654

(51) Int. Cl.
| | |
|---|---|
| *H01R 9/00* | (2006.01) |
| *H05K 3/00* | (2006.01) |
| *H05K 3/34* | (2006.01) |
| *H01L 23/00* | (2006.01) |
| *H05K 3/24* | (2006.01) |
| *H01L 21/683* | (2006.01) |

(52) U.S. Cl.
CPC ....... *H01L 24/12* (2013.01); *H01L 2924/01056* (2013.01); *H01L 2924/014* (2013.01);
(Continued)

(58) Field of Classification Search
USPC ......... 29/831, 842, 846; 427/96.1, 96.2, 97.3, 427/245, 247; 174/250, 255; 438/613; 228/180.22, 248.1, 248.5
See application file for complete search history.

(56) References Cited

U.S. PATENT DOCUMENTS 4,184,941 A * 1/1980 Carlin .......................... 204/292
5,136,363 A 8/1992 Endo et al. ...................... 357/71
(Continued)

FOREIGN PATENT DOCUMENTS

| CN | 1574305 A | 2/2005 |
|---|---|---|
| CN | 1674763 A | 9/2005 |

(Continued)

*Primary Examiner* — Peter DungBa Vo
*Assistant Examiner* — Jeffrey T Carley
(74) *Attorney, Agent, or Firm* — Steptoe & Johnson LLP

(57) ABSTRACT

An electrode structure 100 on which a solder bump is placed includes an electrode pattern 50 made of an electrode-constituting material selected from the group consisting of Cu, Al, Cr, and Ti, a Ni layer 52 formed on a part of the electrode pattern 50, a Pd layer 54 formed on at least a part of a region other than the part of the electrode pattern 50, and an Au layer 56 formed on the Ni layer 52 and the Pd layer 54.

12 Claims, 15 Drawing Sheets

(52) U.S. Cl.
CPC . *H01L 2924/01075* (2013.01); *H05K 2203/083* (2013.01); *H01L 2924/01004* (2013.01); *H01L 2224/133* (2013.01); *H01L 2924/01002* (2013.01); *H01L 2224/0401* (2013.01); *H05K 2203/043* (2013.01); H05K 3/3484 (2013.01); *H01L 2924/01014* (2013.01); *H01L 2224/1308* (2013.01); H01L 24/05 (2013.01); *H01L 2924/01046* (2013.01); *H01L 2924/14* (2013.01); *H01L 2924/01051* (2013.01); *H01L 2224/13171* (2013.01); *H05K 2201/0338* (2013.01); *H01L 2224/13124* (2013.01); *H01L 2924/01047* (2013.01); *H01L 2924/01011* (2013.01); *H01L 2224/13144* (2013.01); *H01L 2924/01078* (2013.01); *H01L 2924/01099* (2013.01); *H01L 2924/00013* (2013.01); *H05K 2203/087* (2013.01); *H01L 2224/131* (2013.01); *H05K 3/3489* (2013.01); *H01L 2924/01082* (2013.01); H01L 24/742 (2013.01); *H01L 2224/13166* (2013.01); *H01L 2224/16* (2013.01); *H01L 2924/0102* (2013.01); *H01L 2924/01013* (2013.01); *H01L 2924/01029* (2013.01); *H01L 2924/01022* (2013.01); H05K 3/244 (2013.01); *H01L 2924/01033* (2013.01); *H01L 2224/13147* (2013.01); *H01L 2224/13164* (2013.01); H01L 24/02 (2013.01); *H01L 2924/01079* (2013.01); *H01L 2224/13082* (2013.01); *H01L 2224/05644* (2013.01); *H01L 2224/11003* (2013.01); *H01L 2924/01005* (2013.01); *H01L 2224/13155* (2013.01); *H01L 2924/01019* (2013.01); *H01L 2224/0558* (2013.01); H01L 21/6835 (2013.01); *H01L 2924/01028* (2013.01); *H01L 2924/01024* (2013.01); H01L 24/11 (2013.01); *H01L 2924/01006* (2013.01); *H05K 2203/0425* (2013.01); *H01L 2224/1329* (2013.01); *H01L 2924/0105* (2013.01); *H01L 2224/13083* (2013.01); *H01L 2224/13084* (2013.01)
USPC ............... 29/842; 29/831; 29/846; 427/96.1; 427/97.3; 427/245; 174/250; 174/255; 438/613; 228/180.22; 228/248.1; 228/248.5

(56) References Cited

U.S. PATENT DOCUMENTS

| | | | | |
|---|---|---|---|---|
| 5,878,943 | A * | 3/1999 | Nishikawa et al. | 228/205 |
| 6,225,569 | B1 * | 5/2001 | Hashimoto et al. | 174/260 |
| 6,313,411 | B1 * | 11/2001 | Budnaitis | 174/255 |
| 6,326,555 | B1 * | 12/2001 | McCormack et al. | 174/255 |
| 6,340,113 | B1 * | 1/2002 | Avery et al. | 228/248.5 |
| 6,774,316 | B1 * | 8/2004 | Suzuki et al. | 174/262 |
| 7,125,788 | B2 | 10/2006 | Domon et al. | |
| 7,531,387 | B1 | 5/2009 | Karashima et al. | |
| 2004/0253803 | A1 | 12/2004 | Tomono et al. | 438/614 |

FOREIGN PATENT DOCUMENTS

| | | |
|---|---|---|
| JP | 09-199505 | 7/1997 |
| JP | 2001-102733 | 4/2001 |
| JP | 2005-277106 | 10/2005 |
| WO | WO2006/095677 A1 | 9/2006 |
| WO | WO 2006/098268 A1 | 9/2006 |
| WO | WO 2006/103948 A1 | 10/2006 |
| WO | WO 2006/109407 A1 | 10/2006 |
| WO | WO 2006/126361 A1 | 11/2006 |

* cited by examiner

US 8,887,383 B2

ELECTRODE STRUCTURE AND METHOD FOR FORMING BUMP

This application is a national stage entry of International Application No. PCT/JP2007/072795, filed Nov. 27, 2007 designating the U.S., which claims the benefit of Japanese Application No. 2006-339654, filed Dec. 18, 2006.

TECHNICAL FIELD

The present invention relates to an electrode structure on which a solder bump is placed and a method for forming the bump on the electrode structure.

BACKGROUND ART

In recent years, as semiconductor ICs (LSIs) have been used for electronic equipment with higher densities and higher levels of integration, the electrode terminals of LSI chips have rapidly increased in the number of pins with narrower pitches. For the mounting of the LSI chips on a wiring substrate, flip-chip mounting has been widely used to reduce a wiring delay. In flip-chip mounting, solder bumps are formed on the electrode terminals of LSI chips and the LSI chips are collectively joined via the solder bumps to electrodes formed on a wiring substrate.

In the prior art, plating and screen printing have been developed as techniques for forming bumps. Plating is suitable for narrow pitches but results in a complicated process and low productivity. Screen printing can achieve high productivity but is not suitable for narrow pitches because a mask is used.

Under these circumstances, some techniques for selectively forming solder bumps on LSI chips or the electrodes of a wiring substrate have been developed in recent years. Since these techniques are suitable for forming small bumps and can collectively form solder bumps, these techniques have achieved high productivity and received attention as techniques applicable to mounting on wiring substrates of next-generation LSIs.

One of the techniques is called solder paste method (for example, see Japanese Patent Laid-Open No. 2000-94179). In this technique, solder paste which is a mixture of solder powder and flux is applied over a substrate on which electrodes have been formed, and then the solder powder is melted by heating the substrate, so that solder bumps are selectively formed on the electrodes having high wettability.

Further, in a technique called super solder method (for example, see Japanese Patent Laid-Open No. 1-157796) a paste composition (chemical reaction deposited solder) mainly composed of organic acid lead salt and metallic tin is applied over a substrate on which electrodes have been formed, and then substitution is performed on Pb and Sn by heating the substrate, so that a Pb—Sn alloy is selectively deposited on the electrodes of the substrate.

Moreover, in a technique called Super Juffit method (for example, see Japanese Patent Laid-Open No. 7-74459), a substrate on which electrodes have been formed is immersed into an agent to form an adhesive coating only on the surfaces of the electrodes, and then solder powder is brought into contact with the adhesive coating to bond the solder powder onto the electrodes. After that, molten solder is selectively formed on the electrodes by heating the substrate.

DISCLOSURE OF THE INVENTION

The foregoing solder paste method has been originally developed as a technique for selectively forming a precoat of solder on electrodes formed on a substrate. Thus in order to apply this technique to the formation of bumps required for flip-chip mounting, it is necessary to solve the following problems.

In the foregoing solder paste method, a paste composition is supplied as a coating on the substrate, causing local variations in thickness and concentration. Thus an amount of solder deposition varies among electrodes and it is difficult to obtain uniform bumps. Further, in these methods, a paste composition is supplied as a coating on an uneven wiring substrate having electrodes formed thereon. Thus it is difficult to stably supply a sufficient amount of solder onto the electrodes which are convex portions.

Moreover, for a material of chemical reaction deposited solder used in super solder method, a specific chemical reaction is used. Thus the freedom of choice of solder compositions is restricted and some problems remain in the elimination of Pb.

In Super Juffit method, solder powder is evenly bonded on electrodes, thereby achieving uniform solder bumps. Further, Pb is advantageously eliminated with ease because of the enhanced freedom of choice of solder compositions. However, Super Juffit method requires a process of selectively forming an adhesive coating on the surfaces of electrodes and this process requires a special chemical treatment using a chemical reaction, so that the process becomes complicated and the cost is increased. Thus there are still some problems in applying Super Juffit method to a volume production process.

Therefore, regarding bump forming techniques, problems have arisen not only in prevailing techniques such as plating and screen plating but also in newly developed techniques. The present inventors have considered that the development of a new bump forming method would lead to a highly potential technique regardless of existing bump forming techniques, and have conducted research and development.

The present invention has been devised in view of this point. A main object of the present invention is to provide a method for forming bumps with high productivity. Another object of the present invention is to provide an electrode structure suitable for the method for forming bumps.

An electrode structure of the present invention is an electrode structure on which a solder bump is placed, including: an electrode pattern made of an electrode-constituting material selected from the group consisting of Cu, Al, Cr, and Ti; a Ni layer formed on a part of the electrode pattern; a Pd layer formed on at least a part of a region other than the part of the electrode pattern; and an Au layer formed on the Ni layer and the Pd layer.

According to a preferred embodiment, the Ni layer is formed at the center of the electrode pattern and the Pd layer is formed on the electrode pattern so as to surround the Ni layer.

An electrode structure of the present invention is an electrode structure on which a solder bump is placed, including: an electrode pattern made of an electrode-constituting material selected from the group consisting of Cu, Al, Cr, and Ti; a Ni layer formed on at least a part of the electrode pattern; a Pd layer covering the Ni layer; and an Au layer covering the Pd layer.

According to a preferred embodiment, the Ni layer is formed at the center of the electrode pattern.

Moreover, an electrode structure of the present invention is an electrode structure on which a solder bump is placed, including: an electrode pattern made of an electrode-constituting material selected from the group consisting of Cu, Al, Cr, and Ti; a Pd layer formed on the electrode pattern; and an Au layer formed on the Pd layer.

According to a preferred embodiment, the electrode pattern is disposed on one of a glass substrate and a resin substrate.

A method for forming a bump according to the present invention, when the bump is formed on the electrode pattern of a substrate, the method including: (a) supplying onto the electrode pattern a fluid containing conductive particles and a bubble generating agent; (b) disposing a plate member on the substrate via the fluid; (c) heating the fluid to generate bubbles from the bubble generating agent and self-assembling the conductive particles on the electrode pattern with the bubbles; and (d) remelting the self-assembled conductive particles and curing the conductive particles on a Ni layer formed on at least a part of the electrode pattern.

According to a preferred embodiment, a metal is applied on the electrode pattern, the metal being absorbed into the self-assembled conductive particles during the remelting.

A method for forming a bump according to the present invention, when the bump is formed on an electrode structure, the method including: (a) supplying onto the electrode structure a fluid containing conductive particles and a bubble generating agent; (b) disposing a plate member on the electrode structure via the fluid; (c) heating the fluid to generate bubbles from the bubble generating agent so as to self-assemble the conductive particles on the electrode structure; and (d) remelting the self-assembled conductive particles and curing the conductive particles on a Ni layer formed on at least a part of the electrode pattern of the electrode structure.

According to a preferred embodiment, the method further includes removing the plate member after (c).

According to a preferred embodiment, the bubble generating agent contained in the fluid in (a) is made of one of a material boiling when the fluid is heated in (c) and a material generating gas by thermal decomposition.

According to a preferred embodiment, in (c), the fluid supplied onto the substrate is heated in contact with the plate member.

According to a preferred embodiment, in (c), a gap is provided between the plate member and the electrode pattern formed on the substrate.

According to a preferred embodiment, the gap is wider than the particle diameter of the conductive particle.

According to a preferred embodiment, in (c), a constant gap is kept by applying a constant pressure to the plate member and the fluid is heated while being pressed.

According to a preferred embodiment, in (c), the bubbles generated from the bubble generating agent are discharged from the surrounding part of a gap provided between the plate member and the substrate.

A method for forming a bump according to the present invention, when the bump is formed on an electrode structure according to claim 5, the electrode structure including: an electrode pattern made of an electrode-constituting material selected from the group consisting of Cu, Al, Cr, and Ti; a Pd layer formed on the electrode pattern; and an Au layer formed on the Pd layer, the method including: (a) supplying onto the electrode structure a fluid containing conductive particles and a bubble generating agent; (b) disposing a plate member on the electrode structure via the fluid; (c) heating the fluid to generate bubbles from the bubble generating agent and self-assembling the conductive particles on the electrode structure with the bubbles; and (d) remelting the self-assembled conductive particles and curing the conductive particles on the electrode pattern.

According to a preferred embodiment, in (c), a gap between the plate member and the substrate is changed in size during the heating process.

According to a method for forming bumps according to the present invention, after a fluid containing conductive particles and a bubble generating agent is supplied onto a region including electrodes on a wiring substrate, a plate member is disposed on the wiring substrate via the fluid. Next, the fluid is heated to generate bubbles from the bubble generating agent contained in the fluid, the conductive particles are self-assembled on the electrodes with the bubbles, and then the self-assembled conductive particles are remelted. Through the remelting, metals can be absorbed and alloyed into the self-assembled conductive particles, so that the bumps can be increased in height. Further, bubbles are generated from the bubble generating agent by heating the fluid, so that the conductive particles can be self-assembled on the electrodes. Thus the bumps can be formed with high productivity. Furthermore, by remelting the self-assembled bumps, the heights of the bumps can be equalized (leveling) during reshaping.

According to an electrode structure of the present invention, a Ni layer is formed on at least a part of an electrode pattern made of an electrode-constituting material, a Pd layer covering the Ni layer is formed, and an Au layer covering the Pd layer is formed. Thus Pd and Au are absorbed and alloyed into the self-assembled conductive particles, so that solder bumps composed of the self-assembled conductive particles can be increased in height.

BEST MODE FOR CARRYING OUT THE INVENTION

The present applicant has diligently examined a method for forming bumps by self-assembly of conductive particles (for example, solder powder) on the electrodes of a wiring substrate and a semiconductor chip and the like or a method for forming connecting members between electrodes by self-assembly of conductive particles between the electrodes of a wiring substrate and a semiconductor chip and for flip-chip mounting the semiconductor chip. After the examination, the present applicant has proposed a new method for forming bumps and a new flip-chip mounting method (Japanese Patent Application No. 2004-257206 (Japanese Patent Laid-Open No. 2006-100775), Japanese Patent Application No. 2004-365684 (Japanese Patent Application No. 2006-548871), and Japanese Patent Application No. 2005-094232 (Japanese Patent Application No. 2007-510386)). These patent applications are cited for reference in the present specification.

FIGS. 1A to 1D and FIGS. 2A to 2D show the basic process of the method for forming bumps as disclosed by the present applicant in the specifications of the patent applications.

Figure 1A:
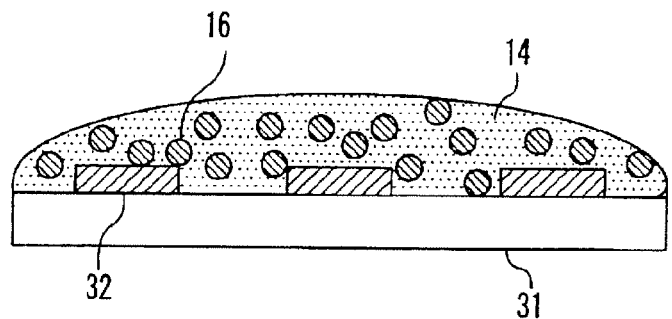
FIGS. 1A-D are process sectional views showing a method for forming bumps by using the self-assembly of resin.

First, as shown in FIG. 1A, a fluid 14 containing conductive particles 16 and a bubble generating agent (not shown) is supplied onto a substrate 31 having a plurality of electrodes 32. In this configuration, the conductive particles are solder powder and the fluid 14 is resin.

Figure 1B:
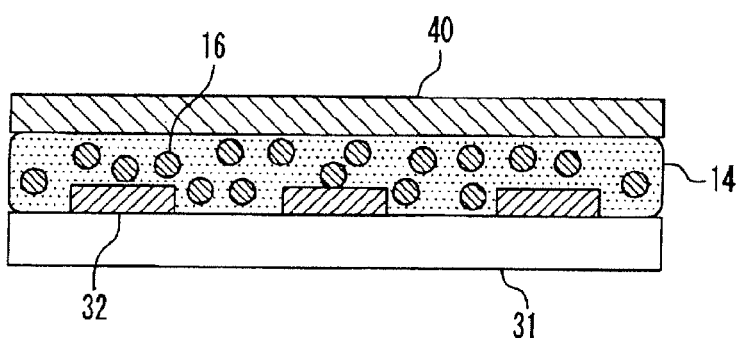

Next, as shown in FIG. 1B, a flat plate member 40 is disposed on the surface of the fluid 14.

Figure 1C:
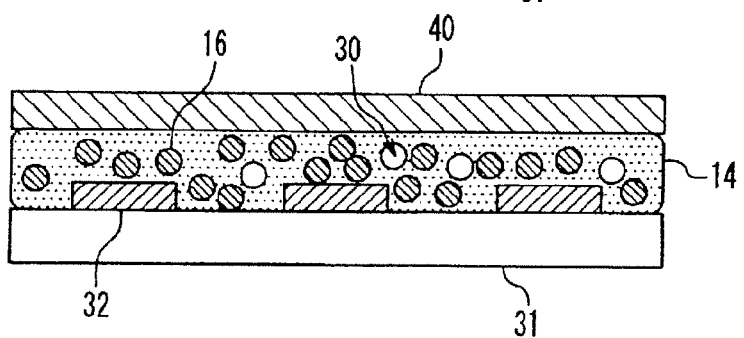
Figure 1D:
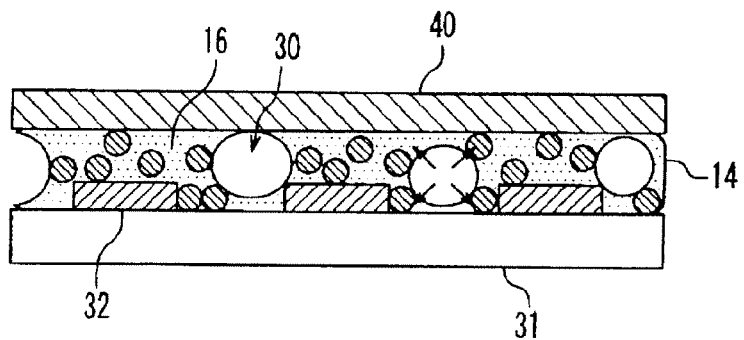

In this state, the fluid 14 is heated and thus bubbles 30 are generated as shown in FIG. 1C from the bubble generating agent contained in the fluid 14. After that, as shown in FIG. 1D, the generated bubbles 30 grow in the fluid 14, so that some of the bubbles 30 are pressed out of the outer edge of the substrate 31.

Figure 2A:
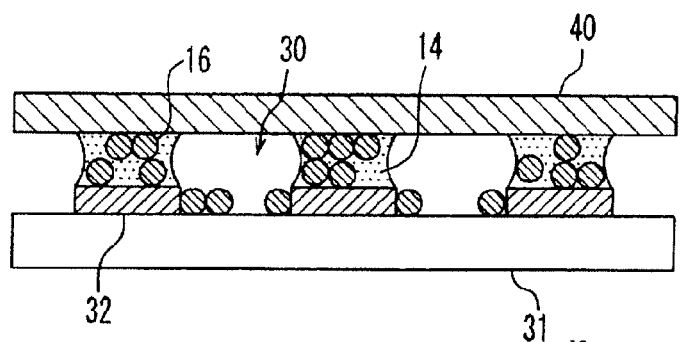
FIGS. 2A-D are process sectional views showing the method for forming the bumps by using the self-assembly of the resin.
Figure 2B:
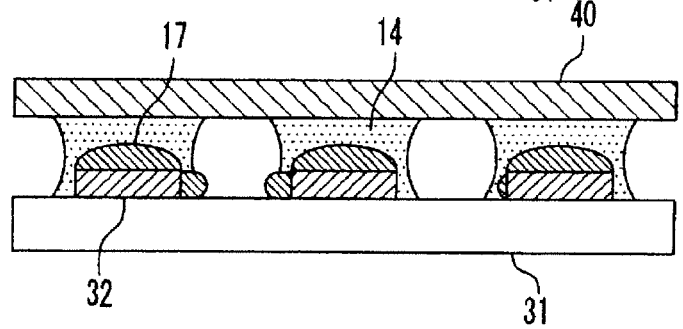

As shown in FIG. 2A, the pressed fluid 14 is self-assembled like columns on interfaces with the electrodes 32 of the substrate 31 and an interface with the plate member 40. The fluid 14 is then further heated and as shown in FIG. 2B, the solder powder 16 contained in the fluid 14 is melted, so that the solder powder 16 contained in the self-assembled resin 14 on the electrodes 32 is fusion bonded.

Figure 2C:
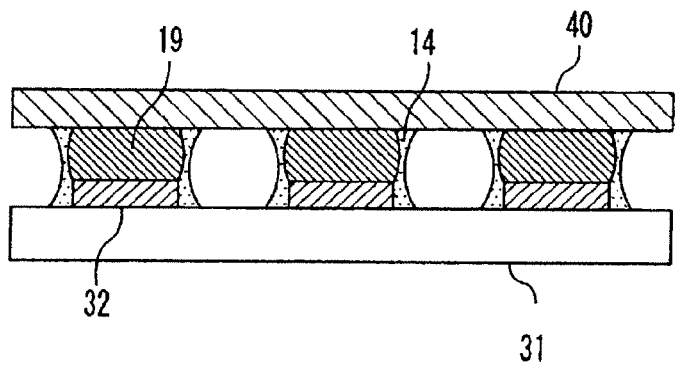
Figure 2D:
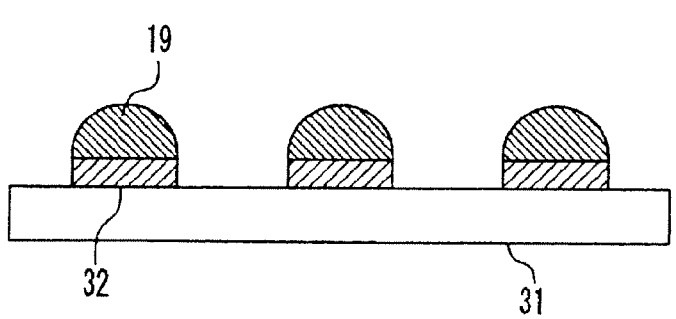

Since the electrodes 32 have high wettability to the fusion-bonded solder powder 16, as shown in FIG. 2C, solder bumps 19 composed of the molten solder powder are formed on the electrodes 32. Finally, as shown in FIG. 2D, the fluid 14 and the plate member 40 are removed, so that the substrate 31 having the solder bumps 19 formed on the electrodes 32 is obtained.

A feature of this method is that the bubbles 30 are generated from the bubble generating agent by heating the fluid 14 supplied into a gap between the substrate 31 and the plate member 40 and the fluid 14 is pressed out by the bubbles as the bubbles 30 grow, so that the fluid 14 is self-assembled between the electrodes 32 of the substrate 31 and the plate member 40.

Figure 3A:
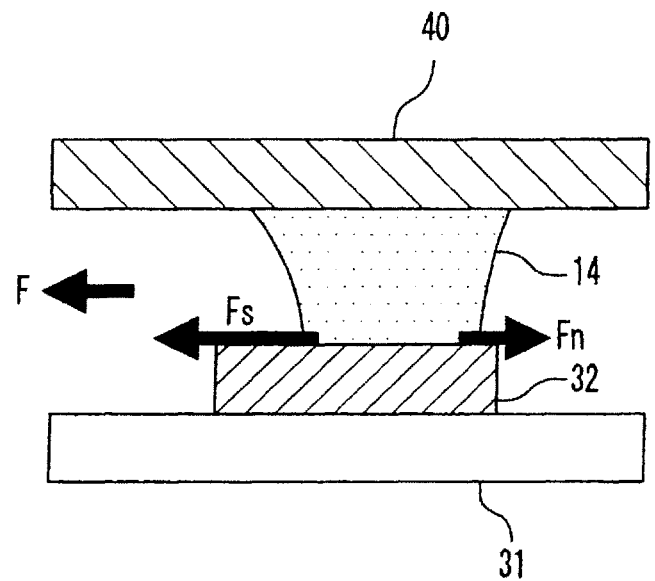
FIGS. 3A-B are an explanatory drawings showing a mechanism where the resin self-assembles.
Figure 3B:
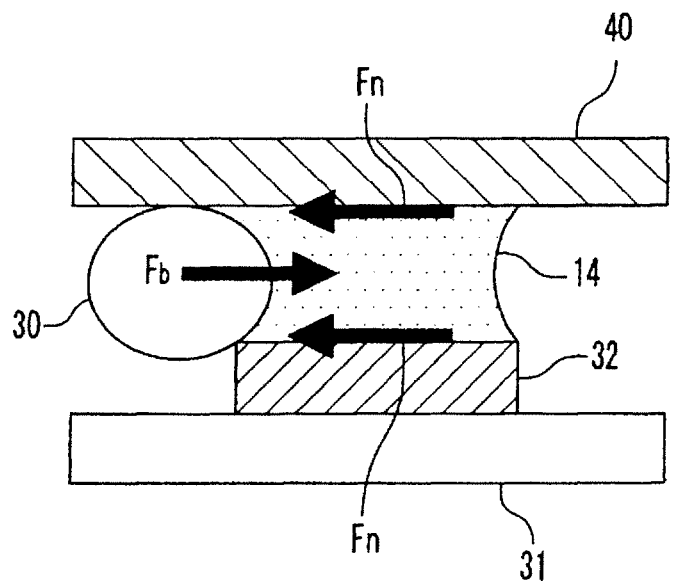

It is considered that the fluid 14 is self-assembled on the electrodes 32 by a mechanism shown in FIGS. 3A and 3B.

FIG. 3A shows that the fluid 14 is pressed onto the electrode 32 of the substrate 31 by a grown bubble (not shown). The fluid 14 in contact with the electrode 32 has an interfacial tension (that is, a force caused by extended wet resin) Fs on the interface and the interfacial tension Fs is larger than a stress $F\eta$ generated according to a viscosity $\eta$ of the fluid 14. Thus the fluid 14 spreads over the electrode 32 and the columnar fluid 14 is finally formed between the electrode 32 and the plate member 40 with the end of the electrode 32 serving as a boundary.

On the columnar fluid 14 formed by self-assembly on the electrode 32, a stress Fb generated by the growth (or movement) of the bubble 30 is applied as shown in FIG. 3B but the shape of the fluid 14 can be kept by the action of the stress $F\eta$ generated according to the viscosity $\eta$ of the fluid 14. The fluid 14 self-assembled once does not disappear.

In this case, whether the shape of the self-assembled fluid 14 can be kept constant or not depends upon an area S of the electrode 32, a distance L of a gap between the electrode 32 and the plate member 40, and the viscosity $\eta$ of the fluid 14 in addition to the interfacial tension Fs. The following relationship is qualitatively established:

$$T=K \cdot (S/L) \cdot \eta \cdot Fs \text{ (K is a constant)}$$

where T is an index for keeping constant the shape of the fluid 14.

As has been discussed, this method forms the fluid 14 on the electrodes 32 in a self-aligned manner by using self-assembly made by the interfacial tension of the fluid 14. It can be said that the self-assembly made by the interfacial tension uses a phenomenon occurring in a space on the electrodes 32, the space being reduced in size in the gap formed between the substrate 31 and the plate member 40 because the electrodes 32 formed on the surface of the substrate 31 are convexly formed.

The method proposed by the present applicant allows solder powder having been dispersed in resin to efficiently self-assemble on electrodes and can form bumps with high uniformity and productivity. Further, this method allows the solder powder dispersed in the fluid 14 to evenly self-assemble on the plurality of electrodes on the substrate where the fluid 14 has been supplied. Thus this method is particularly useful when bumps are collectively formed on all the electrodes on the wiring substrate where the fluid 14 has been supplied.

The present inventors have considered that the technical value of the method can be enhanced by easily increasing the heights of the solder bumps. The present inventors have diligently examined the technique and achieved the present invention.

The following will describe embodiments of the present invention with reference to the accompanying drawings.

In the following drawings, constituent elements having substantially the same functions are indicated by the same reference numerals to simplify the explanation. The present invention is not limited to the following embodiments.

Figure 4:
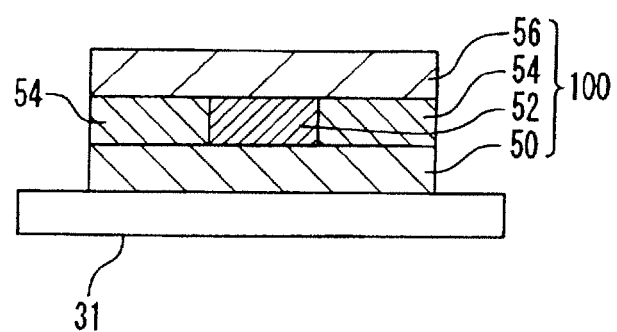
FIG. 4 is a sectional schematic view showing an electrode structure 100 according to an embodiment.

Referring to FIG. 4, the following will discuss the configuration of an electrode structure 100 used for a method for forming bumps according to the present embodiment.

FIG. 4 is a sectional schematic view schematically showing the sectional configuration of the electrode structure 100 according to the present embodiment.

The electrode structure 100 is an electrode structure having solder bumps placed thereon and the electrode structure 100 is disposed on a substrate 31. The electrode structure 100 of the present embodiment is made up of an electrode pattern 50, a Ni layer 52 and a Pd layer 54 which are formed on the electrode pattern 50, and an Au layer 56 formed on the Ni layer and the Pd layer.

The electrode pattern 50 is formed on the substrate 31 and is made of an electrode-constituting material (e.g., one of Cu, Al, Cr, and Ti). The constituting material of the electrode pattern 50 can be properly selected according to the material of the substrate 31. In the illustrated example, the substrate 31 is a glass substrate and an electrode-constituting material selectable at this point is, for example, one of Cr and Ti. When the substrate 31 is a resin substrate, the electrode-constituting material can be, for example, one of Cu and Al. Further, the electrode pattern 50 of the present embodiment has a thickness of, for example, 10 μm to 1000 μm.

The Ni layer 52 is formed on at least a part of the electrode pattern 50. The Ni layer 52 of the present embodiment is disposed at the center of the electrode pattern 50. The Ni layer 52 is a metal layer which is hardly dissolved into conductive particles (e.g., solder powder) having been melted during heating.

In addition to the Ni layer 52, the Pd layer 54 is formed on the electrode pattern 50. The Pd layer 54 is formed on at least a part other than a region where the Ni layer has been formed on the electrode pattern 50. The Pd layer 54 of the present embodiment is disposed so as to surround the Ni layer 52 disposed at the center of the electrode pattern 50. The Pd layer 54 is a metal layer which is easily eroded by molten solder. In the illustrated example, the top surface of the Ni layer 52 and the top surface of the Pd layer 54 are flush with each other. The Ni layer 52 and the Pd layer 54 are, for example, 10 μm to 3000 μm in thickness.

Further, the Au layer 56 is formed on the Ni layer 52 and the Pd layer 54. During the formation of solder bumps, the Au layer 56 prevents oxidation on the Ni layer 52 and the Pd layer 54 which are disposed under the Au layer 56. The Au layer of the present embodiment is, for example, 10 μm to 200 μm in thickness.

Figure 5:
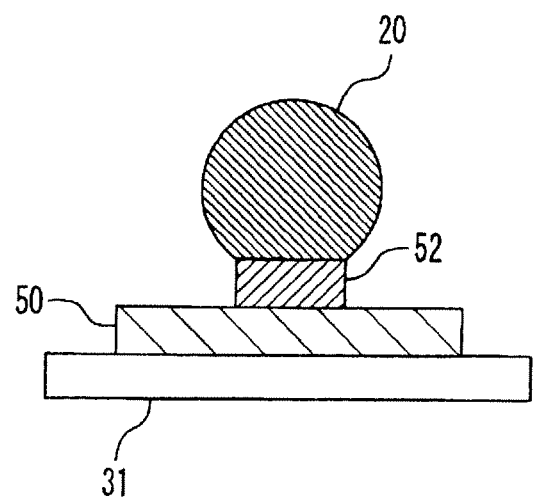
FIG. 5 shows a state after a bump is formed using the electrode structure 100 of the present embodiment.

FIG. 5 shows a state after a solder bump 20 is placed using the electrode structure 100 of FIG. 4 according to a self-assembly method. The solder bump 20 is formed on the electrode pattern 50 via the Ni layer 52 which has higher wettability to molten solder than a surrounding part. As illustrated in this example, of metals composing the electrode structure 100, Pd and Au are easily eroded by molten solder. Thus the Pd layer 54 and the Au layer 56 are absorbed and alloyed into molten solder, so that the solder bump 20 on the electrode pattern 50 is taller than the solder bump 19 shown in FIG. 2D. According to the electrode structure 100 of the present embodiment, the Ni layer 52 is formed on at least a part of the electrode pattern 50 made of an electrode-constituting material, the Pd layer 54 covering the Ni layer 52 is formed, and the Au layer 56 covering the Pd layer 54 is formed. Thus Pd and Au can be absorbed and alloyed into self-assembled conductive particles (e.g., solder powder), so that the solder bumps composed of the self-assembled conductive particles (e.g., solder powder) can be increased in height.

Referring to FIGS. 6A to 6E, the following will more specifically describe the solder bumps 20 which can be increased in height.

FIGS. 6A to 6E show a basic process for forming the solder bumps 20 by using the electrode structure 100 of the present embodiment according to the self-assembly method.

Figure 6A:
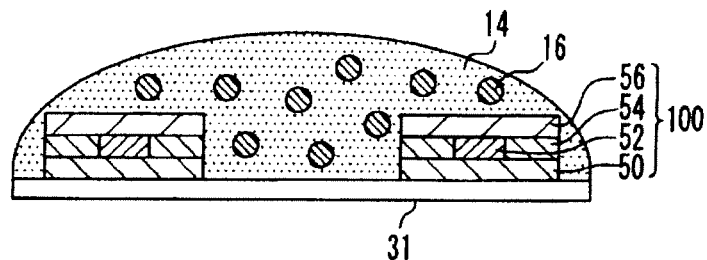
FIGS. 6A-E are process sectional views showing a method for forming bumps according to the embodiment of the present invention.

First, as shown in FIG. 6A, the fluid 14 containing the conductive particles 16 and a bubble generating agent (not shown) is supplied onto a region including the electrode structures 100 on the substrate 31. The conductive particles 16 of the present embodiment are solder powder. The fluid 14 of the present embodiment is epoxy resin. The epoxy resin acting as the fluid 14 contains a solder activator (not shown) for preventing the solder powder from being oxidized, in addition to the solder powder (SnAgCu solder powder in this example) acting as the conductive particles 16. The solder activator of the present embodiment is flux. In this example, the solder activator is obtained by blending an activator with rosin synthetic resin.

For example, regarding the ratios of components contained in the fluid 14 of the present embodiment, the epoxy resin has 10 parts by weight, the solder powder has 30 parts by weight, and the flux has 60 parts by weight. These ratios can be properly adjusted according to various conditions for forming the solder bumps. For example, relative to the epoxy resin having 10 parts by weight, the solder powder may have 40 parts by weight and the flux may have 50 parts by weight. Alternatively, relative to the epoxy resin having 10 parts by weight, the solder powder may have 60 parts by weight and the flux may have 30 parts by weight.

Figure 6B:
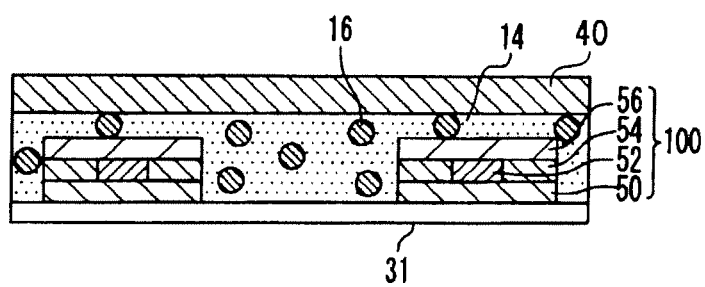

Next, as shown in FIG. 6B, the plate member 40 is disposed on the substrate 31 via the fluid 14. The plate member 40 is, for example, a glass substrate. The plate member 40 is not limited to a glass substrate and may be one of a ceramic substrate and a semiconductor substrate (such as a silicon substrate). By using a translucent substrate as the plate member 40, it is possible to easily confirm the progress of a process and the formation of bumps.

The surface of the plate member 40 may be one of a flat surface and an uneven surface (e.g., a projection-bearing surface). On the surface of the plate member 40, when the projection-bearing surface is formed so as to face a region where the fluid 14 has been supplied, a surface tension between the projection-bearing surface and the fluid 14 can prevent the fluid 14 from being dispersed during heating. Alternatively, the substrate 31 and the plate member 40 may be first disposed with a constant gap, and then the fluid 14 may be supplied into the gap. The gap between the substrate 31 and the plate member 40 is set wider than the particle diameter of the conductive particle 16.

Figure 6C:
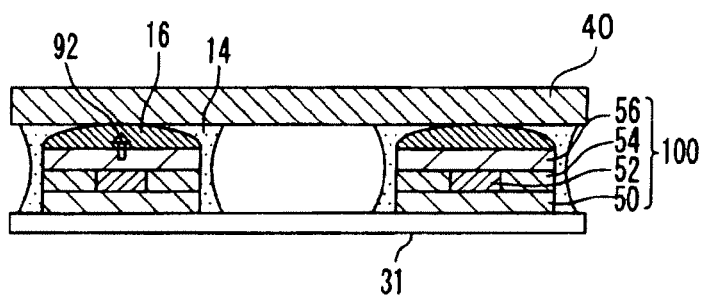

When the fluid 14 is heated in the state of FIG. 6B, bubbles 30 are generated from the bubble generating agent contained in the fluid 14. In the present embodiment, heat is applied while the plate member 40 is fixed in contact with the fluid 14. The fluid 14 is pressed out by the bubbles 30 during the growth of the generated bubbles 30. After that, as shown in FIG. 6C, the pressed fluid 14 is assembled between the plate member 40 and the electrode structures 100 by an interfacial tension, and the conductive particles 16 in the fluid 14 are assembled on the electrode structures 100. Moreover, the conductive particles 16 contained in the fluid 14 are melted by heating, so that the first self-assembly of the conductive particles 16 is completed. At this point, the Au layer 56 of the electrode structure 100 is eroded by the molten conductive particles 16 as indicated by an arrow 92, and is absorbed and dispersed into the molten conductive particles 16. In other words, in this example, the solder bumps 19 which are composed of the conductive particles 16 containing absorbed and alloyed Au are formed on the Ni layer 52 and the Pd layer 54. After that, the plate member 40 is removed, so that the substrate 31 is obtained with the solder bumps 19 formed on the electrode patterns 50 via the Ni layer 52 and the Pd layer 54, as shown in FIG. 6D.

During the self-assembly of the conductive particles 16, the Au layer 56 is eroded by the molten conductive particles 16, whereas the Pd layer 54 covered with the Au layer 56 is hardly eroded by the molten conductive particles 16. This is because the solder activator (e.g., flux) having the function of an antioxidant of the conductive particles 16 is deactivated. In other words, the solder activator is deactivated in the self-assembly time of the conductive particles 16 and thus the molten conductive particles 16 are oxidized and do not dissolve dissimilar metals at the erosion of the Au layer 56. Thus the Pd layer 54 formed under the Au layer is not eroded by the molten conductive particles 16. Another reason why the Pd layer 54 is not eroded is that Pd has a smaller diffusion coefficient than Au.

Figure 6D:
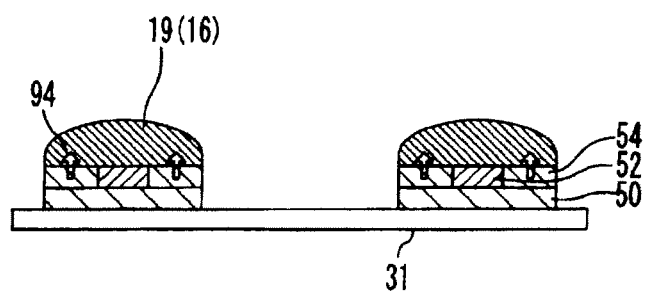

Next, when heat is further applied in the state of FIG. 6D (that is, an open state after the plate member 40 is removed), the solder bumps 19 composed of the conductive particles 16 having self-assembled on the Ni layer 52 and the Pd layer 54 are remelted. The conductive particles 16 are remelted in a state in which another solder activator (e.g., flux) is supplied. The addition of the solder activator removes oxides in the conductive particles 16, so that the conductive particles 16 can melt dissimilar metals again. Thus when the conductive particles 16 are remelted, the Pd layer 54 is eroded by the remelted conductive particles 16 and is absorbed and alloyed into the molten conductive particles 16 as indicated by arrows 94. The solder activator added during reheating may be the same as the first added solder activator or may be a solder activator containing different components. When adding a different solder activator from the first added solder activator, it is possible to properly select and add a solder activator containing a constituent facilitating the erosion of Pd.

Figure 6E:
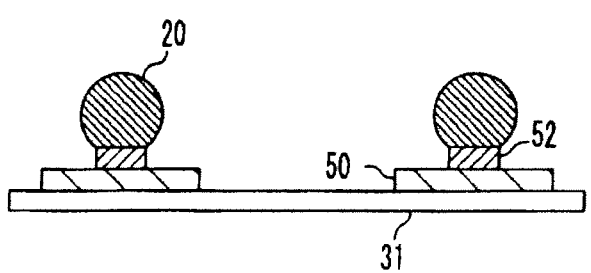

As shown in FIG. 6E, the conductive particles 16 containing absorbed and alloyed Pd do not assemble on the electrode patterns 50 made of Cr but assemble on the Ni layer 52 having higher wettability to the molten conductive particles 16 than Cr, so that the second self-assembly of the conductive particles 16 is completed. In other words, the solder bumps 20 composed of the conductive particles 16 containing absorbed and alloyed Au and Pd are formed on the electrode patterns 50 via the Ni layer 52. Since the solder bumps 20 contain Pd, the solder bumps 20 are taller than the solder bumps 19 which have been formed in the first heating shown in FIG. 6D. The reheating may be performed at the same temperature as the first heating or at a higher temperature than the first heating.

By remelting, metals (Au and Pd, particularly Pd in the present embodiment) can be absorbed and alloyed into the self-assembled conductive particles 16, so that the solder bumps 20 composed of the conductive particles 16 can be increased in height. Additionally, remelting is performed in the open state after the plate member 40 is removed, so that the solder bumps 20 become hemispheric. Thus the solder bumps 20 can be further increased in height. Moreover, bubbles are generated from the bubble generating agent by heating the fluid 14, so that the conductive particles 16 can be self-assembled on the electrodes. Thus the bumps can be formed with high productivity. Furthermore, by remelting the self-assembled solder bumps 19, the heights of the solder bumps 20 can be equalized (leveling) during reshaping.

Metals which can be absorbed and alloyed into the molten conductive particles 16 are not limited to Pd and Au and other metals may be absorbed and alloyed. For example, Ag may be absorbed and alloyed into the molten conductive particles 16. In other words, the electrode structure may be composed of an Ag layer in addition to the Pd layer. Alternatively, a region other than the electrode pattern 50 may be covered with an Ag-containing organic film and the like, and Ag may be absorbed from the organic film into the molten conductive particles 16. A metal to be absorbed into the molten conductive particles 16 can be properly selected based on the solubility of the metal to the molten conductive particles 16 and the diffusion coefficient of the metal in the molten conductive particles 16.

The leveling effect on the bumps through remelting can be obtained also by a typical electrode structure (for example, a Cu single layer structure indicated by the electrodes 32 of FIG. 1) other than the electrode structure 100. In this case, the heights of the bumps cannot be increased but can be equalized by remelting the bumps.

Further, the bumps which can be increased in height by the electrode structure 100 are not limited to the bumps formed by self assembly. The bumps may be formed using other techniques. For example, even in the case of bumps formed by a transfer method, Pd can be absorbed and alloyed into the molten conductive particles 16 by remelting the bumps with the electrode structure 100, so that the bumps can be increased in height after reshaping.

The sizes and the relative positional relationship of the configurations (for example, the size of the conductive particle 16 and the distance of the gap between the substrate 31 and the plate member 40) in FIGS. 6A to 6E are conveniently illustrated to simplify the explanation. Thus the actual sizes and so on are not shown.

Figure 7A:
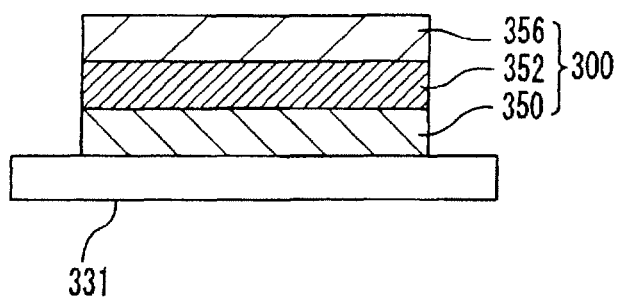
FIGS. 7A-B include structural diagrams of an electrode structure 300 not including a Pd layer and a structural diagram after a bump is formed.

FIG. 7A shows an example of an electrode structure 300 not including a Pd layer.

Figure 7B:
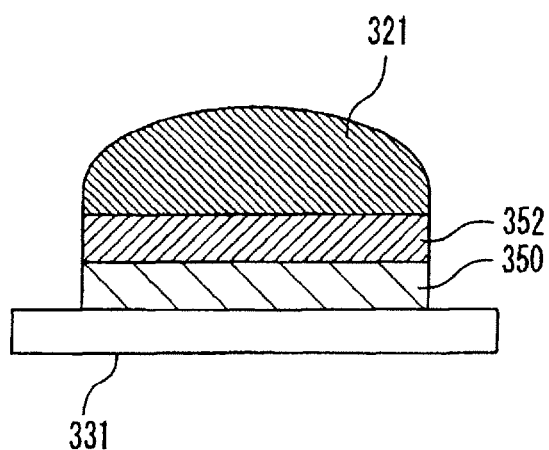

In other words, a Ni layer 352 is disposed on an electrode pattern 350 formed on a substrate 331, and an Au layer 356 is directly formed on the Ni layer 352 without being disposed via a Pd layer. Even when solder bumps are formed using the electrode structure 300 not including a Pd layer, the thin Au layer 356 is selectively absorbed into solder as shown in FIG. 7B. However, it is difficult to increase the heights of solder bumps 320.

The configuration of the electrode structure 100 and a method of manufacturing the same will be more specifically described according to the present embodiment.

First, referring to FIGS. 8A to 9B, the following will discuss the method of manufacturing the electrode structure 100 according to the present embodiment.

Figure 8A:
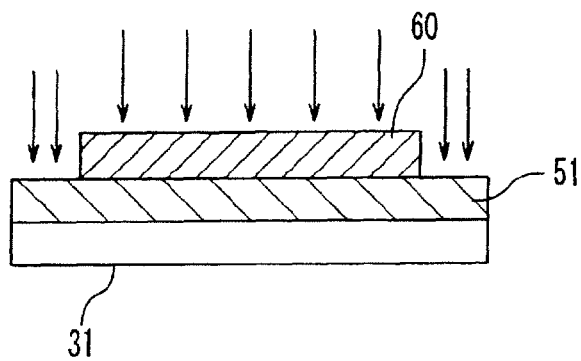
FIGS. 8A-8D are process sectional views showing a method for forming the electrode structure 100 according to the embodiment of the present invention.

First, as shown in FIG. 8A, an electrode-constituting material 51 (Cr in this example) composing the electrode pattern 50 is stacked on the substrate 31 (a glass substrate in this example), and a photoresist 60 having a predetermined pattern is formed on the electrode-constituting material 51. The illustrated photoresist 60 is formed on the same position as the electrode pattern 50 to be subsequently formed. Next, the exposed electrode-constituting material 51 is removed by etching and then the photoresist 60 is removed, so that the electrode pattern 50 of FIG. 8B is obtained.

Figure 8B:
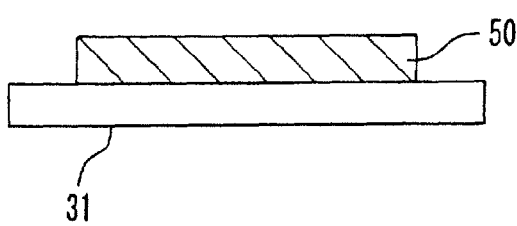

After that, from the state of FIG. 8B, Ni plating is performed over the substrate 31 by electroless plating. By electroless plating, reduced Ni is deposited on a metal surface which is thermodynamically unstable (in this case, on the electrode pattern 50. Thus a Ni layer 53 can be selectively stacked on the electrode pattern 50.

Figure 8C:
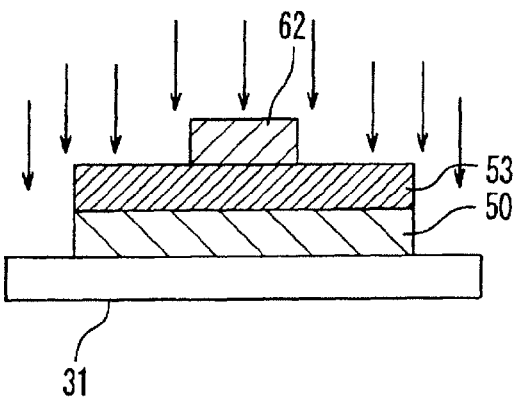
Figure 8D:
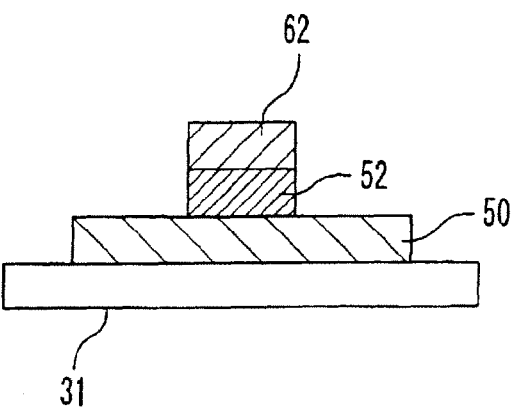

Next, as shown in FIG. 8C, a photoresist 62 having a predetermined pattern is formed on the Ni layer 53 and unnecessary Ni is removed by etching, so that the Ni layer 52 shown in FIG. 8D is obtained.

Figure 9A:
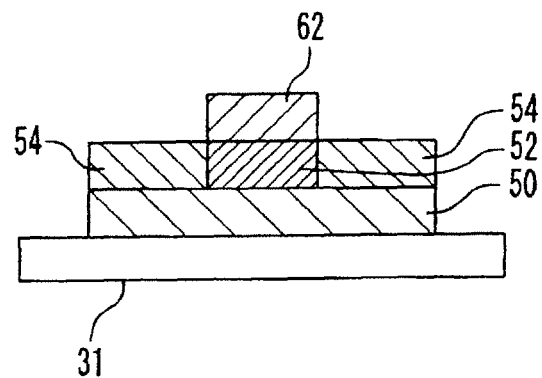
FIGS. 9A-B are process sectional views showing the method for forming the electrode structure 100 according to the embodiment of the present invention.

After that, from the state of FIG. 8D, Pd plating is performed over the substrate 31 by electroless plating, so that the Pd layer 54 can be formed on the electrode pattern 50 as shown in FIG. 9A. At this point, the photoresist 62 acts as a mask covering the surface of the Ni layer 52. Thus the Pd layer 54 is stacked on the electrode pattern 50 so as to surround the Ni layer 52 disposed at the center. After that, the photoresist 62 is removed.

Figure 9B:
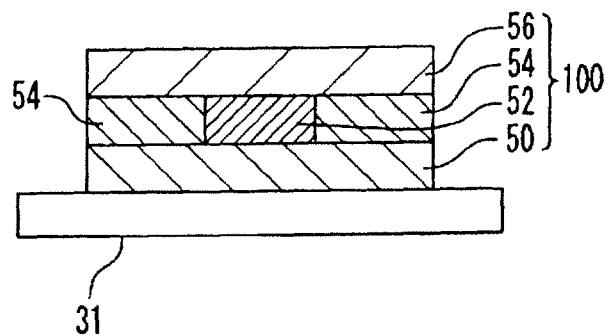

Finally, as shown in FIG. 9B, the Au layer 56 is selectively stacked on the Ni layer 52 and the Pd layer 54 by electroless plating, so that the electrode structure 100 of the present embodiment is obtained.

Figure 10A:
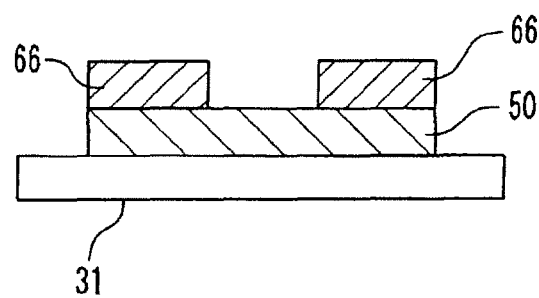
FIGS. 10A-B are process sectional views showing a method for forming the electrode structure 100 according to another embodiment of the present invention.
Figure 10B:
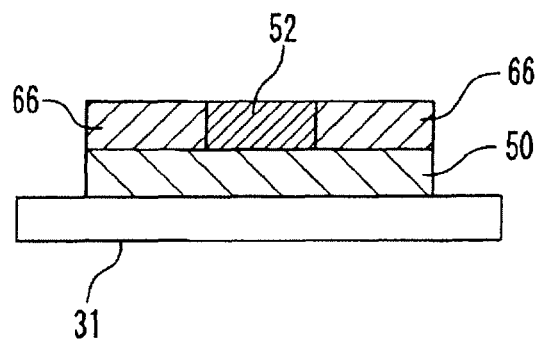

The process of forming the Ni layer 52 on the electrode pattern 50 shown in FIGS. 8B to 8D may be performed without using etching as shown in FIGS. 10A and 10B. In other words, as shown in FIG. 10A, a photoresist 66 having a predetermined pattern is formed on the electrode pattern 50, and Ni is stacked over the substrate 31 by electroless plating with the photoresist 66 serving as a mask, so that the Ni layer 52 can be formed as shown in FIG. 10B.

In the example of FIGS. 8 and 9, the Ni layer 52 is formed on the electrode pattern 50 and then the Pd layer 54 is formed. The Ni layer 52 and the Pd layer 54 may be formed in reverse order. In other words, the Pd layer 54 may be first stacked and then the Ni layer 52 may be stacked.

In the foregoing example, the metal layers (the Ni layer 52, the Pd layer 54, and the Au layer 56) are selectively formed using electroless plating. The method of forming the metal layers is not particularly limited and other methods may be used for forming the metal layers. For example, the Au layer 56 may be formed using sputtering.

The foregoing embodiment described an example in which the Pd layer 54 absorbed and alloyed into the solder of the molten conductive particles and the Ni layer 52 having the solder bump 20 placed thereon are adjacent to each other. The Pd layer 54 and the Ni layer 52 may not be adjacent to each other. For example, another member may be interposed between the Pd layer 54 and the Ni layer 52. The member interposed between the Pd layer 54 and the Ni layer 52 may be a metal layer (e.g., an Ag layer) which can be absorbed and alloyed into molten solder other than a Pd layer or a member which cannot be absorbed and alloyed into molten solder.

The Pd layer absorbed and alloyed into molten solder may be formed not only next to the Ni layer but also on the Ni layer. For example, FIG. 11A shows an example of an electrode structure 200 having a Pd layer formed on a Ni layer.

The electrode structure 200 is made up of an electrode pattern 250, a Ni layer 252 formed on at least a part of the electrode pattern 250, a Pd layer 254 covering the Ni layer 252, and an Au layer 256 covering the Pd layer 254.

Figure 11A:
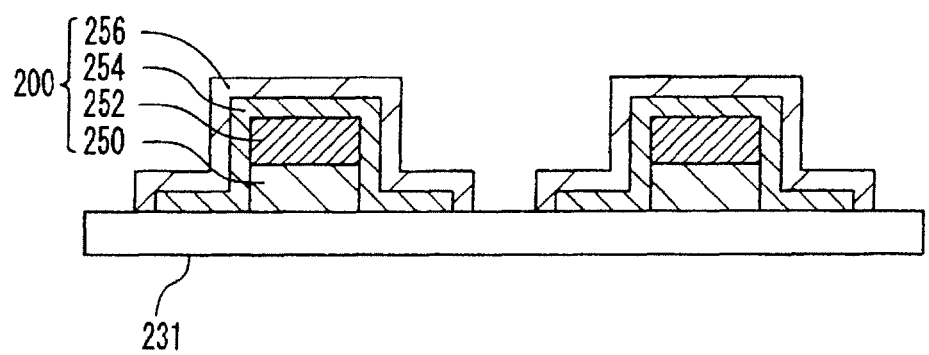
FIGS. 11A-B include structural diagrams showing an electrode structure 200 according to another embodiment of the present invention and a structural diagram after bumps are formed.

In the example of FIG. 11A, the Ni layer 252 is formed over a region on the electrode pattern 250 of a substrate 231. The Pd layer 254 is stacked over the Ni layer 252 so as to cover the Ni layer 252. In other words, the Pd layer 254 is formed also on the top surface of the Ni layer 252. On the Pd layer 254, the Au layer 256 is disposed so as to cover the Pd layer 254.

Figure 11B:
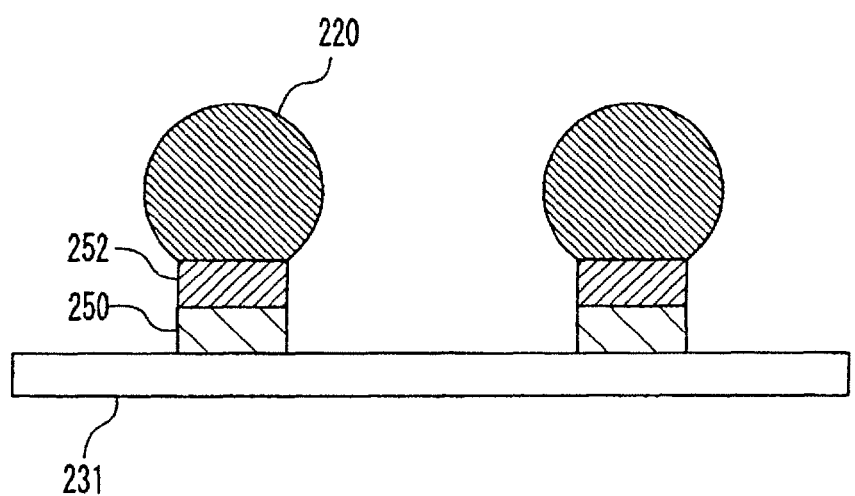

By using the electrode structures 200, bumps are formed as shown in FIG. 11B.

Also when the Pd layer 254 is disposed thus on the Ni layer 252, the Pd layer 254 on the Ni layer 252 is absorbed and alloyed into molten solder. Thus a tall solder bump 220 can be formed on the electrode pattern 250. Further, in this example, the Ni layer 252 is formed over the region on the electrode pattern 250, so that the tall bump can be formed over the region of the electrode pattern 250 via the Ni layer 252.

In this way, solder melted by reheating assembles on the Ni layer which has higher wettability to molten solder than the electrode pattern. In other words, the Ni layer defines a region where a bump can be formed after remelting. Thus by properly changing the formation region of the Ni layer on the electrode pattern, the region where a bump can be formed can be set at a proper position.

Figure 12A:
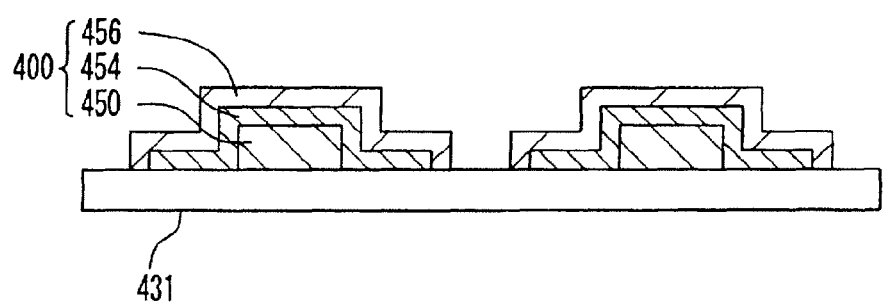
FIGS. 12A-B include structural diagrams showing an electrode structure 400 according to still another embodiment of the present invention and a structural diagram after bumps are formed.
Figure 12B:
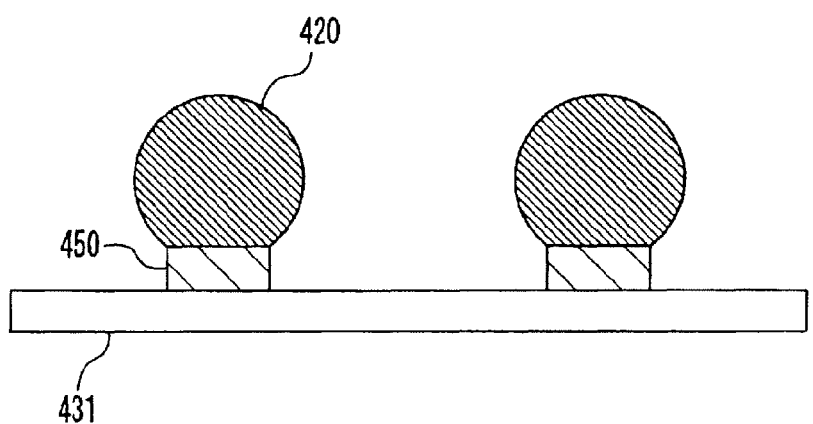

Moreover, a tall bump can be directly formed on the electrode pattern without being formed via the Ni layer. For example, FIG. 12A shows an example of an electrode structure 400 which is obtained by omitting the Ni layer from the electrode structure 200 of FIG. 11A. As shown in FIG. 12B, tall solder bumps 420 in which Au and Pd are absorbed and alloyed can be directly formed on electrode patterns 450 of a substrate 431 without the Ni layer. Solder assembles on the electrode patterns after remelting. This is because the electrode pattern 450 has higher wettability to molten solder than a surrounding region (in this example, the surface of the substrate 31). However, the formation of bumps via the Ni layer is suitable because the bumps can be more firmly fixed on the electrode patterns with an interfacial tension during the remelting of the bumps. In this example, an electrode-constituting material composing the electrode pattern 450 is Cu.

Figure 13A:
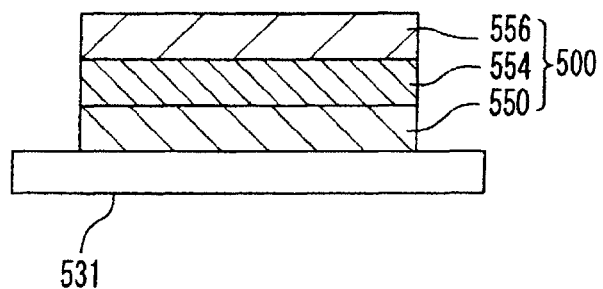
FIGS. 13A-C include structural diagrams showing an electrode structure 500 according to still another embodiment of the present invention, a structural diagram showing a bump being formed, and a structural diagram after the bump is formed.
Figure 13B:
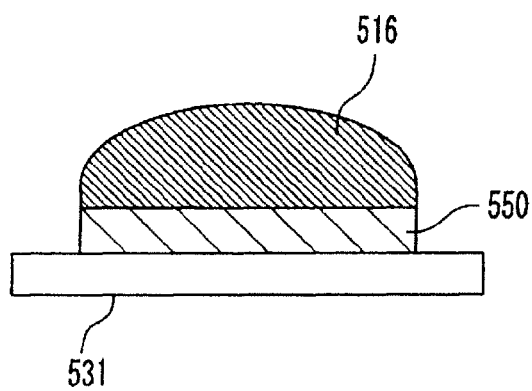
Figure 13C:
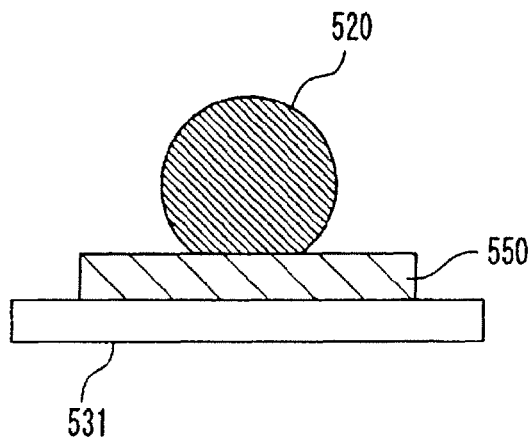

FIG. 13A shows an example of substantially the same configuration as the electrode structure 400. FIG. 13A shows an example in which the electrode-constituting material of an electrode pattern 550 of a substrate 531 is changed from Cu to Ti (or Cr). Also when the electrode-constituting material is Ti (or Cr), molten solder can be assembled on the electrode pattern 550 as shown in FIG. 13B. Since Ti (or Cr) composing the electrode pattern 550 has poor wettability to molten solder alloyed with Au/Pd, molten solder 516 assembled on the electrode pattern 550 is reduced in surface area, so that a formed solder bump 520 can further grow in the height direction as shown in FIG. 13C.

In the foregoing method for forming bumps, as shown in FIGS. 6A to 6E, the fluid 14 is self-assembled between the plate member 40 and the electrodes of the substrate 31, and then the tall solder bumps 20 are obtained by remelting the solder bumps 19 in a state in which the plate member 40 is removed. A method for forming bumps is not limited to the foregoing method.

Figure 14A:
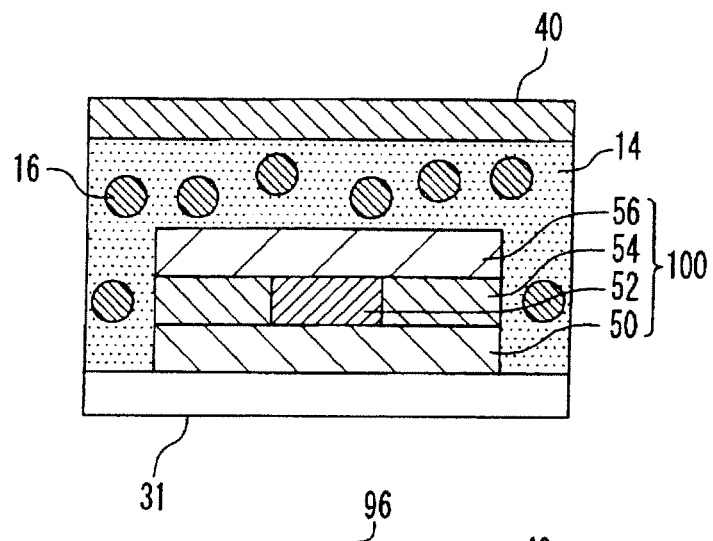
FIGS. 14A-C are process sectional views showing a method for forming a bump according to still another embodiment of the present invention.
Figure 14B:
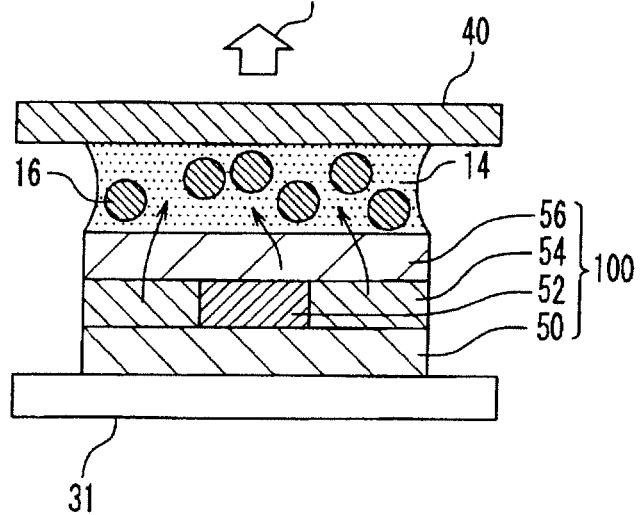
Figure 14C:
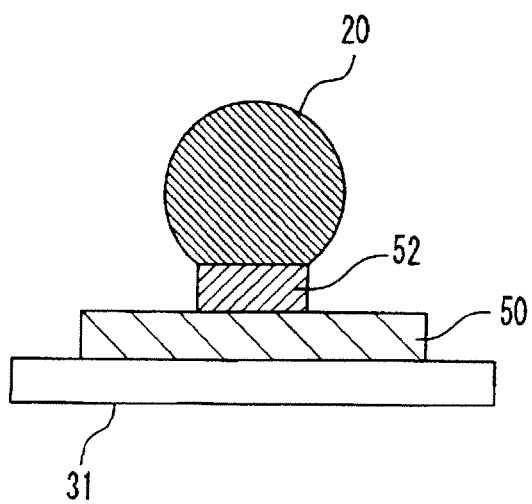

For example, as shown in FIGS. 14A to 14C, the tall solder bump 20 can be formed by a single heating process without remelting the bump.

First, as shown in FIG. 14A, the plate member 40 is disposed on the substrate 31 via the fluid 14, and then the fluid 14 is heated in this state, so that as shown in FIG. 14B, the fluid 14 assembles between the plate member 40 and the electrode structure 100. At this point, the conductive particles 16 contained in the fluid 14 are melted by heating, and the molten conductive particles 16 dissolve not only the Au layer 56 but also the Pd layer 54 disposed under the Au layer 56 (see an arrow 91 and arrows 93 in FIG. 14B). Thus metals (Au and Pd) can be absorbed and alloyed into the self-assembled conductive particles 16, so that as shown in FIG. 14C, the formed solder bump 20 can be increased in height. In this configuration, it is not necessary to remelt the self-assembled bumps and only the single heating process is necessary, so that tall bumps can be easily formed.

In FIG. 14B, the fluid 14 is heated while the plate member 40 is lifted (slid in the direction of an arrow 96) to increase a distance (gap) between the plate member 40 and the substrate 31. The plate member 40 can be lifted by raising the plate member 40 by using, for example, a member capable of sucking the plate member 40. The plate member 40 can be lifted by other suitable techniques. In this example, the plate member 40 is lifted to change the gap between the plate member 40 and the substrate 31. The substrate 31 may be lowered to change the gap between the plate member 40 and the substrate 31.

The fluid 14 is heated thus while the gap between the plate member 40 and the substrate 31 is increased. Thus it is possible to efficiently assemble the fluid 14 between the plate member 40 and the electrodes and tolerate the growth of the conductive particles 16 in the height direction after absorption and alloying. Moreover, it is possible to pull the bumps in the height direction with an interfacial tension according to the lifting of the plate member 40, so that the bumps can be grown in the height direction.

In the foregoing example, the amount and/or components of solder activator contained in the fluid 14 may be properly adjusted such that the solder activator is not deactivated in the self-assembly time of the fluid (in other words, so as to positively erode the Pd layer in the self-assembly time of the fluid).

In order to confirm the effect of the electrode structure according to the present embodiment (for example, the electrode structure 300 of FIG. 13), the present inventor et al. conducted an experiment for measuring a bump height after the first self-assembly shown in FIG. 6D and a bump height after the remelting process shown in FIG. 6E, by using a substrate on which the electrode structures are arranged in a 6×6 matrix (area array).

As a result, bumps were 45 μm in height on average after remelting, whereas bumps were 95 μm in height on average before remelting. The heights of the formed bumps were nearly doubled by remelting. Further, the standard deviation of bump heights was reduced around the remelting, and the effect of leveling was also confirmed.

On the other hand, in an experiment conducted using a typical electrode structure (for example, the electrode structure 200 not including a Pd layer in FIG. 7) under the same conditions, the heights of bumps were not considerably changed by remelting. Thus it was confirmed that in the electrode structure not including a Pd layer, a thin Au layer can be selectively absorbed and alloyed but the heights of bumps cannot be considerably increased by remelting.

For example, the optimum content of the conductive particles (for example, solder powder) 16 in the process of the present embodiment can be set as follows:

When it is assumed that all the conductive particles 16 contained in the volume (VB) of the fluid 14 supplied onto the substrate 31 contribute to the formation of the solder bumps 20 on the electrode patterns 50 of the substrate 31, relational expression (1) is established between the total volume (VA) of the solder bumps 20 and the volume (VB) of the fluid 14 as follows:

$$VA:VB \approx SA:SB \quad (1)$$

where SA is the total area of the electrode pattern 50 of the substrate 31 (the total area of the Ni layer 52 when the solder bumps 20 are formed via the Ni layer 52) and SB is the area of a predetermined region (to be specific, a region where the fluid 14 is supplied) of the substrate 31. Thus the content of the conductive particles 16 in the fluid 14 is expressed by formula (2) below:

$$\text{The content of the conductive particles } 16 = (SA/SB) \cdot 100 [\text{volume \%}] \quad (2)$$

Thus the optimum content of the conductive particles 16 in the fluid 14 is generally set based on formula (3) below:

$$\text{The content of the conductive particles } 16 = (SA/SB) \cdot 100 \pm \alpha [\text{volume \%}] \quad (3)$$

The parameter (±α) adjusts excess and deficiency when the conductive particles 16 self-assemble on the electrode patterns 50 of the substrate 31, and the parameter (±α) can be determined based on various conditions.

Figure 15:
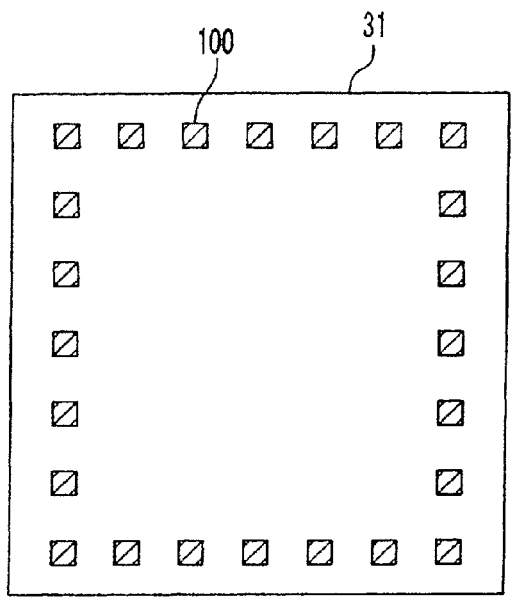
FIG. 15 is a plan view showing a peripheral layout of electrodes.

The electrode patterns 50 of the substrate 31 can be arranged in various forms. When the optimum content of the conductive particles 16 is determined by formula (3) in the typical layouts of the electrode patterns 50 shown in FIGS. 15 and 16, the following values are generally obtained:

The layout of FIG. 15 (peripheral layout) . . . 0.5 volume & to 5 volume %

Figure 16:
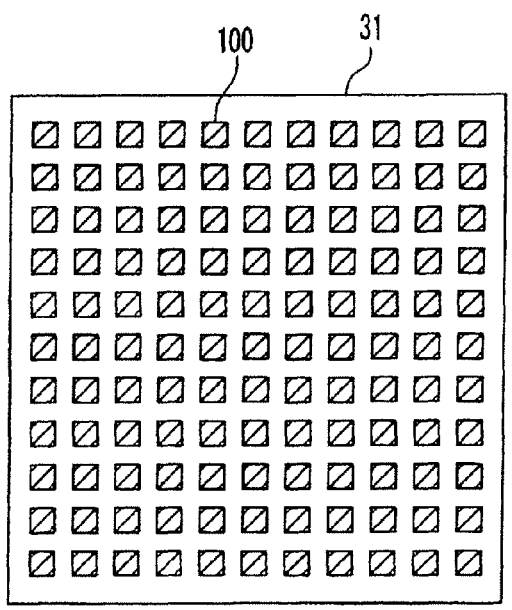
FIG. 16 is a plan view showing an area array layout of electrodes.

The layout of FIG. 16 (area array) . . . 15 volume % to 30 volume %

Thus in order to form the desired solder bumps 20 on the electrode patterns 50, the content of the conductive particles 16 dispersed in the fluid 14 only requires a ratio of 0.5 volumes to 30 volumes.

Generally, a weight ratio between the conductive particles 16 and the fluid 14 is about 7. Thus the ratio of 0.5 volumes to 30 volume % substantially corresponds to the ratio of 4 volumes to 75 volume %.

Figure 17:
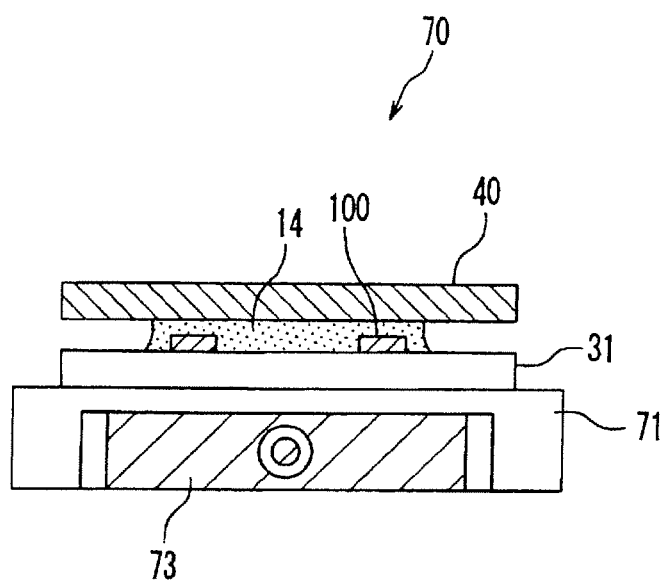
FIG. 17 is a sectional view showing the configuration of a bump forming device according to the embodiment of the present invention.

FIG. 17 shows a suitable bump forming device 70 for performing the method for forming bumps according to the present embodiment.

The bump forming device 70 is made up of a stage 71 on which the substrate 31 is placed and the plate member 40 opposed to the stage 71. In this forming device 70, the fluid 14 containing the conductive particles 16 and the bubble generating agent is supplied between the substrate 31, which is placed on the stage 71, and the plate member 40 opposed to the stage 71. In the configuration of the present embodiment, the plate member 40 is detachable.

The forming device 70 may include a supplier capable of supplying the fluid 14. After the fluid 14 is supplied, bubbles are generated from the bubble generating agent in the fluid 14 by heating the fluid 14. As shown in FIG. 17, the fluid 14 may be heated by a heater 73 provided on the stage 71 or heated by bringing a heater into contact with the plate member 40.

The fluid 14, the conductive particles 16, the solder activator, and the bubble generating agent of the present embodiment are not particularly limited and the following materials may be used:

The fluid 14 may be made of any material as long as the viscosity of the fluid 14 allows flowability in a range from room temperature to the melting temperature of the conductive particles 16. Further, a material which can be reduced in viscosity to have flowability by heating may be included. In addition to the epoxy resin, representative examples are thermosetting resins including phenol resin, silicone resin, diallyl phthalate resin, furan resin, and melamine resin, thermoplastic resins including polyester estramer, fluorine resin, polyimide resin, polyamide resin, and aramid resin, or a photo (UV) curing resin and the like. Alternatively, these materials may be combined. In addition to the resins, high boiler, oil, and so on may be used.

Further, as the conductive particles 16 and the bubble generating agent, materials shown in (Table 1) and (Table 2) may be combined and used as appropriate. By using the conductive particles 16 of a material having a melting point that is higher than the boiling point of the bubble generating agent, bubbles are generated from the bubble generating agent by heating the fluid 14, the fluid is self-assembled, and then the fluid 14 is further heated to melt the conductive particles 16 in the self-assembled fluid, so that metallic bond can be formed between the conductive particles 16.

TABLE 1

| Conductive particles | Melting point (solidus) (° C.) |
|---|---|
| Sn—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |

TABLE 2

| Bubble generating agent | Boiling point (° C.) |
|---|---|
| hexane | 69 |
| vinyl acetate | 72 |
| isopropyl alcohol | 83 |
| water | 100 |
| 1,4-dioxane | 101 |
| butyl acetate | 126 |
| propionic acid | 141 |
| dimethyalmine hydrochloride | 171 |
| dimethyl sulfoxide (DMSO) | 189 |
| ethylene glycol | 198 |
| N-methyl-2-pyrrolidone (NMP) | 204 |
| α-terpineol | 218 |
| butyl carbitol | 231 |
| butyl carbitol acetate | 246 |

The bubble generating agent may be made of at least two materials having different boiling points. The different boiling points cause a difference in the timing of the generation and growth of bubbles, so that the fluid 14 is pressed by the growth of bubbles step by step. Thus the self-assembly process of the fluid 14 is made uniform and thus a conductivity pattern can be formed with high uniformity.

In addition to the materials of (Table 2), the bubble generating agent may be made of a material which allows the thermal decomposition of the bubble generating agent to generate bubbles when the fluid 14 is heated. For the bubble generating agent, materials shown in (Table 3) may be used. For example, in the case of a compound containing crystal water (aluminum hydroxide), water vapor is generated as bubbles by thermally decomposing the bubble generating agent when the fluid 14 is heated.

TABLE 3

| Bubble generating agent | Decomposition temperature (° C.) |
|---|---|
| boric acid | 70~ |
| ammonium metaborate | 120~ |
| sodium hydrogencarbonate | 120-150 |
| 4.4'-oxybis(benzene sulfonyl hydrazide) (OBSH) | 155-165 |
| azodicarbonamide (ADCA) | 197-210 |
| barium metaborate | 200~ |
| N-N'-dinitroso-pentamethylene tetramine (DPT) | 200-250 |
| aluminum hydroxide | 230 |
| calcium aluminate | 230 |
| dawsonite | 230 |

Further, the solder activator may be made of any material as long as the material can act as an antioxidant for the conductive particles 16. Thus the fluid 14 can contain various reducers as well as rosin flux which has been described as an example. Representative examples are abietic acid, acypic acid, ascropic acid, acrylic acid, citric acid, malic acid, and polyacrylic acid. Alternatively, these materials may be combined.

The foregoing explanation described the present invention according to the preferred embodiments. The present invention is not limited to the foregoing description and can, of course, be modified in various ways.

Industrial Applicability

According to the present invention, it is possible to provide a method for forming bumps with high productivity and an electrode structure suitable for the method for such forming bumps.

The invention claimed is:

1. A method for assembling electrically conductive bumps, on electrode patterns on a substrate having electrode patterns thereon, with an Ni layer on at least part of each of the electrode patterns, the method comprising:
   (a) supplying onto the substrate and the electrode patterns a fluid containing conductive particles and a bubble generating agent;
   (b) placing a plate member on the fluid on the substrate and the electrode patterns;
   (c) heating the fluid thereby generating bubbles from the bubble generating agent, the bubbles then causing the conductive particles to collect selectively on each of the electrode patterns; and
   (d) melting the collected conductive particles and curing the melted conductive particles on the Ni layer on at least part of each of the electrode patterns.

2. The method for assembling bumps according to claim 1, wherein an additional metal is applied onto the electrode patterns, the additional metal being absorbed into the conductive particles during melting thereof.

3. A method for assembling electrically conductive bumps, on electrode patterns on a substrate having electrode patterns thereon, with an Ni layer on at least part of each of the electrode patterns, each electrode pattern additionally comprising: material selected from the group consisting of Cu, Al, Cr, and Ti,
   the method comprising:
   (a) supplying onto the substrate and the electrode patterns, a fluid containing conductive particles and a bubble generating agent;
   (b) placing a plate member on the fluid on the electrode substrate and the patterns;
   (c) heating the fluid thereby generating bubbles from the bubble generating agent, the bubbles then causing the conductive particles to collect selectively on each of the electrode patterns; and
   (d) melting the collected conductive particles and curing the melted conductive particles on the Ni layer on at least a part of each of the electrode patterns.

4. The method for assembing bumps according to claim 1, further comprising removing the plate member after the heating (c).

5. The method for assembling bumps according to claim 1, wherein the bubble generating agent in the fluid is one of a material boiling when the fluid is heated and a material generating gas by thermal decomposition.

6. The method for assembling bumps according to claim 1, wherein in the heating (c), the fluid supplied onto the substrate is heated in contact with the plate member.

7. The method for assembling bumps according to claim 1, wherein in the heating (c), gaps are provided between the plate member and each of the electrode patterns on the substrate.

8. The method for assembling bumps according to claim 7, wherein the gaps are wider than a particle diameter of the conductive particles.

9. The method for assembling bumps according to claim 1, wherein in the heating (c), a constant gap is maintained by applying a constant pressure on the plate member and the fluid is heated while being pressed.

10. The method for assembling bumps according to claim 1, wherein in the heating (c), the bubbles generated from the bubble generating agent are discharged from surrounding parts of each gap between the plate member and the substrate.

11. A method for assembling electrically conductive bumps, on electrode patterns having electrode patterns thereon, with an Ni layer on at least part of each of the electrode patterns, the electrode patterns also comprising an electrode-constituting material selected from the group consisting of Cu, Al, Cr, and Ti; a Pd layer formed on the electrode pattern; and an Au layer on the Pd layer, the method comprising:
   (a) supplying onto the substrate and the electrode patterns a fluid containing conductive particles and a bubble generating agent;
   (b) placing a plate member on the fluid on the substrate and the electrode patterns;
   (c) heating the fluid thereby generating bubbles from the bubble generating agent, the bubbles then causing the conductive particles to collect selectively on each of the electrode patterns; and
   (d) melting the collected conductive particles and curing the melted conductive particles on the Ni layer on at least part of each of the electrode patterns.

12. The method for forming bumps according to claim 3, wherein in (c), each gap between the plate member and the substrate is changed in size when the conductive particles are collected.

\* \* \* \* \*